(12) United States Patent
Song et al.

(10) Patent No.: US 9,377,486 B2
(45) Date of Patent: Jun. 28, 2016

(54) THERMAL INTERFACE MATERIAL HANDLING FOR THERMAL CONTROL OF AN ELECTRONIC COMPONENT UNDER TEST

(71) Applicants: David Won-jun Song, Chandler, AZ (US); Christopher Roy Schroeder, Gilbert, AZ (US); Joseph Walczyk, Tigard, OR (US); Lothar Kress, Portland, OR (US); Todd Michael Young, Gilbert, AZ (US); Robert Levi Bennett, Hillsboro, OR (US); Arun Krishnamoorthy, Portland, OR (US); Paul Jonathan Diglio, Beaverton, OR (US); Charles Clifton Fulton, Phoenix, AZ (US); Sruti Chigullapalli, Chandler, AZ (US)

(72) Inventors: David Won-jun Song, Chandler, AZ (US); Christopher Roy Schroeder, Gilbert, AZ (US); Joseph Walczyk, Tigard, OR (US); Lothar Kress, Portland, OR (US); Todd Michael Young, Gilbert, AZ (US); Robert Levi Bennett, Hillsboro, OR (US); Arun Krishnamoorthy, Portland, OR (US); Paul Jonathan Diglio, Beaverton, OR (US); Charles Clifton Fulton, Phoenix, AZ (US); Sruti Chigullapalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/229,808

(22) Filed: Mar. 28, 2014

(65) Prior Publication Data

US 2015/0276798 A1 Oct. 1, 2015

(51) Int. Cl.
*H01L 23/34* (2006.01)
*H01L 23/495* (2006.01)
*G01R 1/04* (2006.01)
*G01R 31/26* (2014.01)

(52) U.S. Cl.
CPC .............. *G01R 1/04* (2013.01); *G01R 31/2601* (2013.01)

(58) Field of Classification Search
CPC ................. H01L 23/49541; H01L 2023/4056; G01R 31/26; G01R 1/04
USPC .................................................. 257/670, 720
See application file for complete search history.

(56) References Cited

U.S. PATENT DOCUMENTS

| | | | |
|---|---|---|---|
| 7,745,898 B2* | 6/2010 | Campbell et al. | 257/433 |
| 2004/0150416 A1* | 8/2004 | Cowan | G01R 1/18 324/750.03 |
| 2005/0200376 A1* | 9/2005 | Yee et al. | 324/765 |
| 2006/0118925 A1* | 6/2006 | Macris et al. | 257/667 |
| 2006/0141671 A1* | 6/2006 | Houle et al. | 438/122 |
| 2006/0244472 A1* | 11/2006 | Hayashi | G01R 31/2874 324/750.08 |
| 2007/0238219 A1* | 10/2007 | Bennett et al. | 438/106 |
| 2012/0098119 A1* | 4/2012 | Refai-Ahmed et al. | 257/714 |
| 2013/0021049 A1* | 1/2013 | Barabi | G01R 1/0458 324/750.08 |
| 2014/0217575 A1* | 8/2014 | Hung | 257/713 |
| 2015/0084182 A1* | 3/2015 | De Cecco | H01L 23/36 257/720 |

\* cited by examiner

*Primary Examiner* — Moazzam Hossain
(74) *Attorney, Agent, or Firm* — Blakely, Sokoloff, Taylor & Zafman LLP

(57) ABSTRACT

Thermal interface material handing is described for thermal control of an electronic component under test. In one example, a thermal control unit is adapted to control the temperature of at least a portion of an electronic component during testing. A pedestal between the thermal control unit and the electronic component conducts heat from the electronic component to the thermal head. A conduit extends through a portion of the pedestal, to permit the flow of a liquid thermal interface material from an external source to a space between the pedestal and the electronic component. The liquid thermal interface material improves heat conduction between the electronic component and the pedestal. An elastomeric seal between the electronic device and the pedestal constrains the thermal interface fluid within the space between the electronic component and the pedestal.

16 Claims, 9 Drawing Sheets

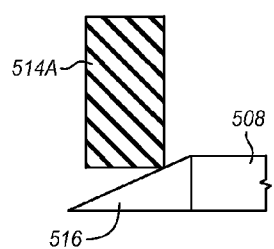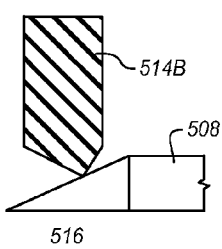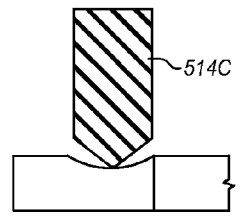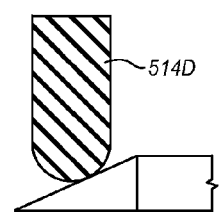
FIG. 7A    FIG. 7B    FIG. 7C    FIG. 7D
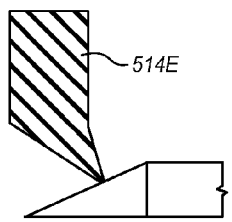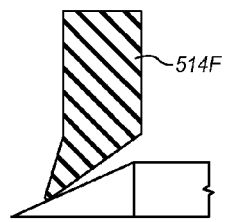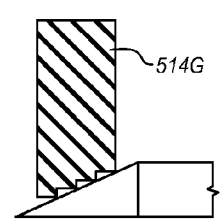
FIG. 7E    FIG. 7F    FIG. 7G

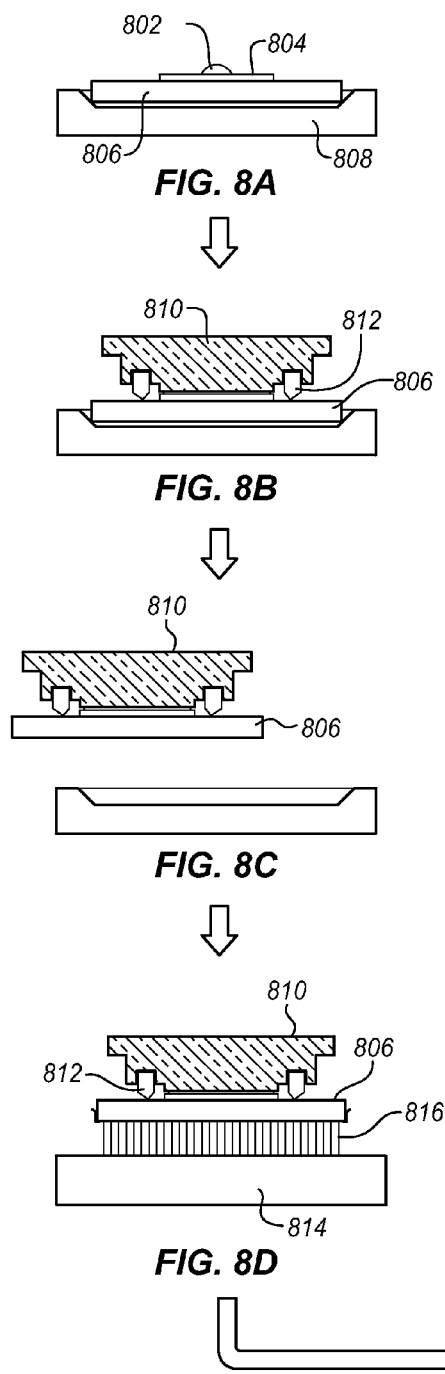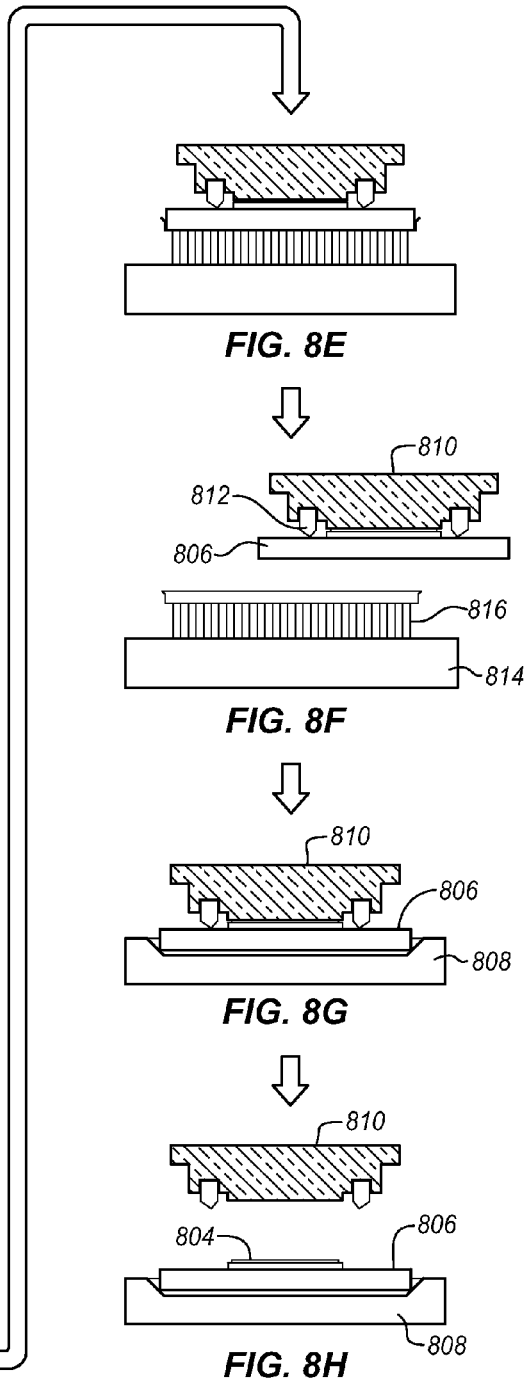

THERMAL INTERFACE MATERIAL HANDLING FOR THERMAL CONTROL OF AN ELECTRONIC COMPONENT UNDER TEST

FIELD

The present description relates to the field of semiconductor device test and, in particular, to the use of liquid thermal interface fluid between a semiconductor device and a thermal control unit.

BACKGROUND

In the fabrication of semiconductor devices, the devices are tested before shipment to ensure correct operation and performance at different temperatures. For this testing, the temperature is carefully controlled to ensure that the device operates correctly under varying cooling and processing loads (silicon heat dissipation). These testing procedures use a thermal control unit that has a temperature-controlled surface for contacting the electronic component being tested. By changing the temperature of this surface, different temperatures and different amounts of cooling can be achieved.

A liquid thermal interface material is used between the thermal control unit surface and the electronic component. The thermal interface material is used to improve the heat flow between the surface and the electronic component. In other words, the thermal interface fluid (IF), also referred to as a liquid thermal interface material (LTIM), reduces thermal contact resistance. The liquid is applied and removed for each component to be tested. The fluid leaves some residue on the thermal control surface which is cleaned as regular maintenance.

The thermal tests may also be used to trim digital temperature sensors and to minimize the temperature rise in silicon transistor junction. In some electronic components, the temperatures sensors are used to trigger the operation of cooling fans and to throttle the operating speed of the component to prevent overheating.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 7A to 7G are side cross-sectional diagrams of different elastomeric seal profiles against an epoxy fillet surrounding a die according to an embodiment.

FIGS. 8A to 8H are side cross-sectional diagrams of stages of testing an electronic component according to an embodiment.

DETAILED DESCRIPTION

An elastomeric seal may be used to create an air-tight chamber around a bare silicon die at the interface between a thermal controller and the die. The seal may be used to create a sealed liquid-tight chamber to contain a thermal interface fluid. There may be one more dies within this chamber. As a result, the evaporated vapor of the interface fluid cannot escape but instead fills and saturates the small air spaces within the liquid-tight chamber surrounding the interface fluid. The space is, in part, due to clearance between the interface fluid and the seal's inner wall. Once the vapor reaches a saturation point within the chamber, the evaporation from the interface fluid and the condensation back into the interface fluid balance each other. This prevents any loss of fluid and provides zero net evaporation.

The elastomeric seal extends the performance of the fluid allowing it to remain stable at higher temperatures. By containing the fluid vapors within an airtight chamber, condensation is prevented both on the thermal control unit and on the microelectronic device. This avoids cosmetic problems and electrical problems that the condensed, dried fluid might cause. The elastomeric seal may also be positioned to provide a push-off force against the DUT (Device Under Test) to prevent the DUT from sticking to the thermal controller.

In addition, the seal may be used together with a pressurized port to remove thermal IF from between the die and the pedestal. A pressurized port near the center of die works together with a vacuum line at the die edges creating a positive pressure at the die center with a negative pressure on the edge. This increases the pressure gradient across the fluid during removal. The same approach may be used even without an edge seal.

Figure 1:
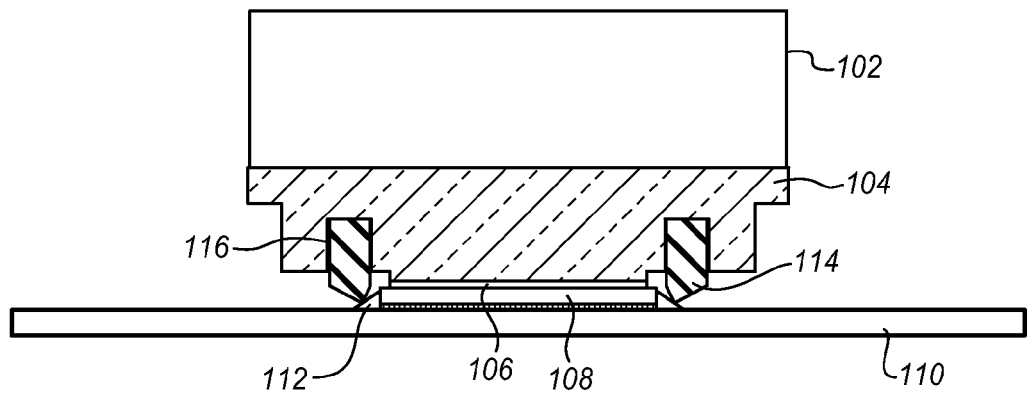
FIG. 1 is a side cross-sectional diagram of test equipment for an electronic component according to an embodiment.

FIG. 1 shows a cross-sectional diagram of test equipment 100 according to the present invention. The test equipment is being applied to test a microprocessor (DUT), which consists of a silicon die 108 attached onto the top of a package substrate 110. The particular form of the DUT may vary depending on the particular application. The approaches described herein may be adapted to suit the nature of the die and of the substrate.

A copper pedestal 104 is placed over the die. The pedestal acts as a heat spreader, as a mechanical interposer underlapping the silicon die to avoid chipping the edge of the die, and as a host for the elastomeric seal. A test thermal head 102 is attached over the pedestal and may be referred to as a TU (Thermal Unit). While a TU may be integral to a bigger test system and therefore very expensive to modify, a pedestal is typically a much cheaper product-specific kit component, which lends itself well for modification.

A layer of thermal IF (interface fluid) 106 is applied at the interface between the pedestal and the DUT. This can be applied through a channel in the pedestal after the pedestal is placed in position. Alternatively, the IF may be applied over the die and then the pedestal placed on top. Extra fluid may be pushed out the sides up to the seal perimeter, to be contained by the seals.

A capillary underfill (CUF) epoxy fillet 112 is applied around the edges of the die over the package substrate. The fillet surrounds the perimeter of the rectangular die on all four sides. An elastomeric seal 114 is attached to the pedestal and extends around the silicon die between the pedestal and the DUT. The elastomeric perimeter seal around the silicon die may be installed onto the pedestal. As shown in this example, the bare die pedestal 104 is modified with a rectangular, "picture-frame" trench 116 around its contact interface to the silicon die. This trench accommodates a mating "picture-frame" elastomeric seal 114, which is seated into the base of the trench 116, as shown in FIG. 1.

Figure 2:
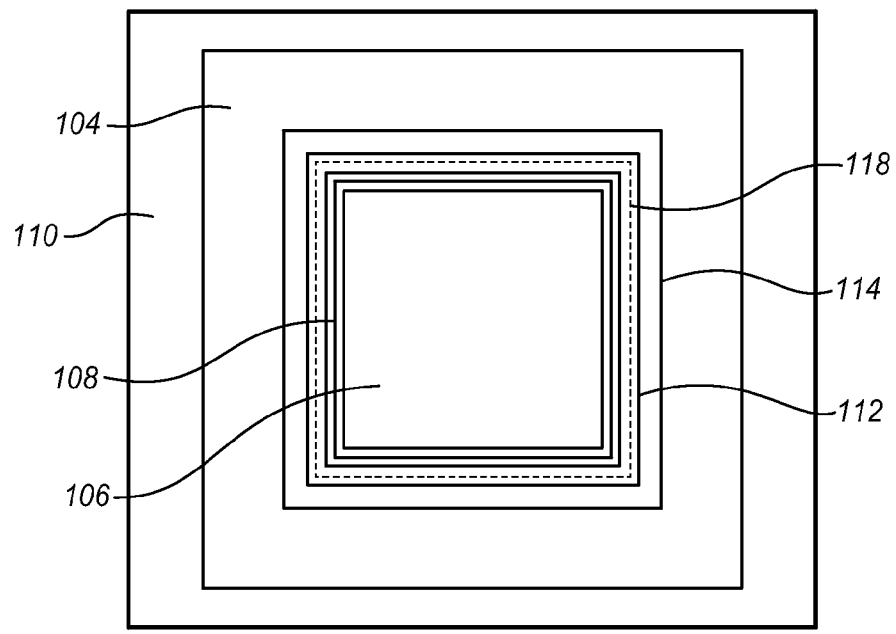
FIG. 2 is a bottom plan view of the pedestal of FIG. 1 according to an embodiment.

FIG. 2 is a top cross-sectional diagram of the diagram of FIG. 1. The die 108 has a rectangular perimeter and is surrounded by the epoxy fillet 112. A line 118 shows where the seal contacts the fillet around the perimeter of the die. FIGS. 1 and 2 show the application of the elastomeric die seal for a capillary underfill (CUF) bare-die DUT. For CUF bare-die, the seal touches onto the slope of the epoxy fillet, as shown.

Figure 3:
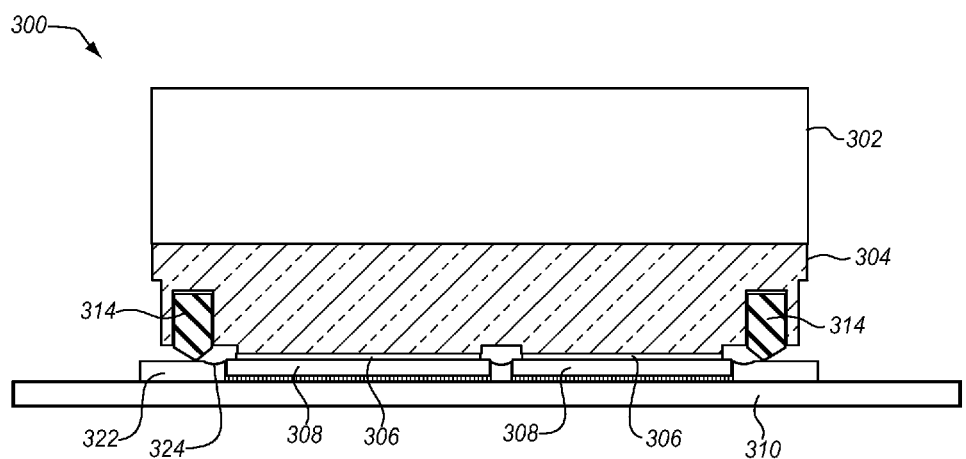
FIG. 3 is side cross-sectional diagram of a pedestal and a MUF bare die DUT according to an embodiment.

FIG. 3 is a cross-sectional diagram of test equipment 300 showing the application of an elastomeric seal for a molded underfill (MUF) bare die DUT. For a MUF bare-die, the seal touches onto the trench around the dies.

In this example, a package substrate 310 carries one or more dies 308. The dies are surrounded with a MUF 322. A trench 324 is formed on the upper surface of the MUF. A pedestal 304 with a peripheral elastomeric seal 314 is placed over all of the dies so that an edge of the seal contacts the MUF outside the trench. This seals the area that contains the trench 324 and the dies 308. When the thermal IF 306 is added, it is confined to the area within the seals including the MUF trench. A thermal head 302 is over the pedestal to carry heat away from and to the die. The surface of the MUF provides a large area for the elastomeric seal to contact, while the trench provides an extra area to hold any TIM fluid that is pushed out between the pedestal and the die.

Figure 4:
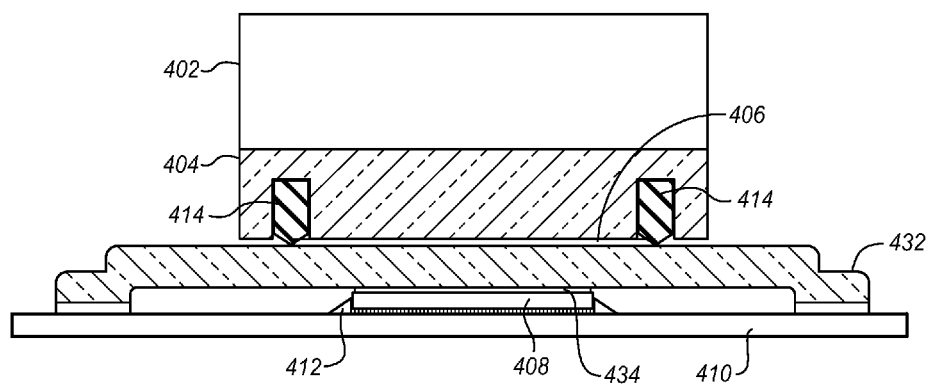
FIG. 4 is a side cross-sectional diagram of a pedestal and a lidded DUT according to an embodiment.

FIG. 4 is a cross-sectional diagram of test equipment 400 showing the application of the elastomeric die seal for a lidded DUT, with an IHS (Integrated Heat Spreader). The package substrate 410 carries one or more dies 408. An epoxy fillet surrounds the dies. The dies are covered for protection and thermal heat spreading with an IHS 432, also sometimes referred to as a package cover or die lid. A thermal interface material 434 ensures that heat is conducted well between the dies and the IHS. The IHS is typically formed of a thermally conductive material such as a metal (typically copper).

A pedestal 404 with an integrated elastomeric seal 414 is placed over the IHS. The seal edge touches and contacts a top surface of the IHS over the die. A TU 402 is over the pedestal and the pedestal thermally conducts heat between the IHS and the thermal head. Conventionally, in testing an IHS DUT, a TU makes a direct contact with the IHS. With the seal a pedestal may be used, which inserts additional thermal resistance. For some short tests or fast thermal response tests, the thermal head may be attached directly to the lid without a pedestal or seal.

Figure 5:
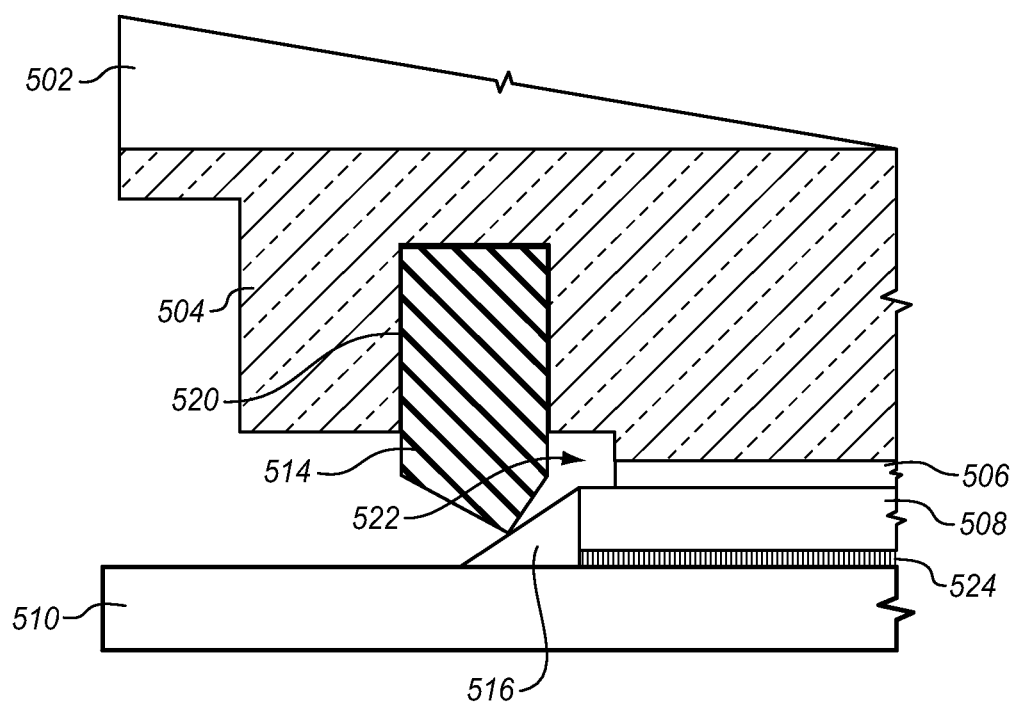
FIG. 5 is an enlarged side cross-sectional diagram of a pedestal seal on a packaged die according to an embodiment.

FIG. 5 is a cross-sectional diagram of a detail of an edge of a packaged die to show a working principle of the elastomeric seal for a CUF package. A die or other type of chip 508 is soldered to a package substrate 510, interposer or other substrate. The solder connection is filled with an underfill 524 between the die and the substrate. The edge of the die is surrounded by an epoxy fillet 516 on the substrate and against the outer perimeter wall of the die. The pedestal 504 is placed over the die and a perimeter elastomeric seal 514 held by a trench 520 in the pedestal is pressed against the epoxy fillet to form a seal. A thermal head 502 is placed over the pedestal.

After an airtight seal is achieved around a silicon die 508 and a thermal IF 506, the initial (partial) evaporation of the IF occurs. The IF vapor resulting from the evaporation fills and saturates a cavity 522 between the edge of the silicon die and the elastomeric seal 514. Once vapor saturation occurs, the amount of evaporation from liquid IF and the condensation of vapor back to liquid is conserved (i.e. 100% humidity leads to precipitation), which prevents further net evaporation.

The depth of the trench 520 in the pedestal and the height of the elastomeric seal 514 may be systematically chosen so that, once installed, the seal touches down onto the target surface, for example the epoxy fillet 516, with the proper amount of pre-load. Insufficient preload will compromise the seal performance. On the other hand, excessive preload will result in an increase in bond line thickness of the thermal interface material between the pedestal and the DUT, resulting in a poorer thermal performance. In other words, the pedestal will not be sufficiently close to the silicon die to ensure thermal flow between the two. Some pre-load will add the additional benefit of the DUT being pushed off the pedestal at the time of the DUT being released.

The width of the trench and the width of the elastomeric seal may also be chosen for a snug or no-slack fit, such that the seal is securely retained in the pedestal and does not drop from the pedestal.

Figure 6A:
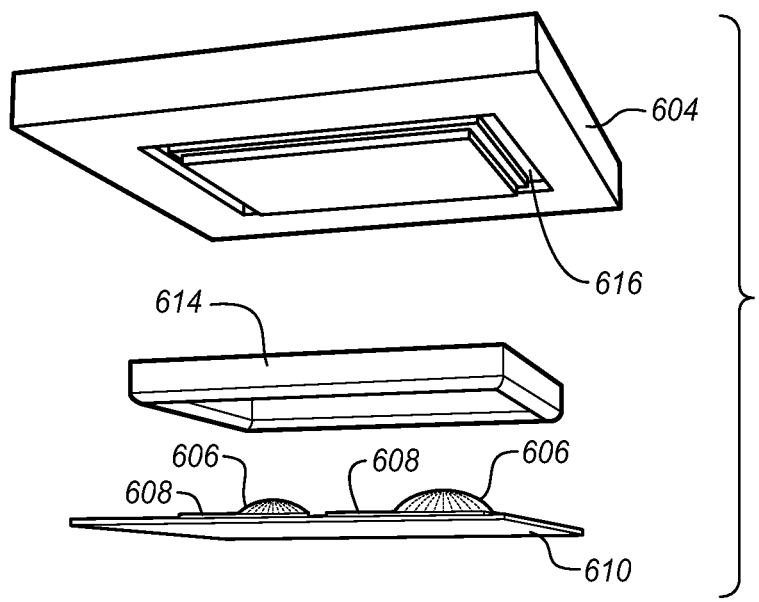
FIG. 6A is an exploded isometric assembly diagram of pedestal and an MCP bare die DUT according to an embodiment.

FIG. 6A shows an exploded isometric assembly view including a multi-chip package (MCP) bare-die DUT 608 on a package substrate 610. Thermal IF 606 is applied over each die so that when a pedestal 604 is pressed over the dies, the IF will be spread out over the surface of each die and form a thermal connection from the dies to the pedestal. The pedestal has an elastomeric seal 614 and a modified pedestal 604 with a trench to host the seal 616. Installation of the seal may be done by push inserting the seal into the snug fit trench of the pedestal. The pedestal is installed onto a test thermal head in any of a variety of different ways.

Figure 6B:
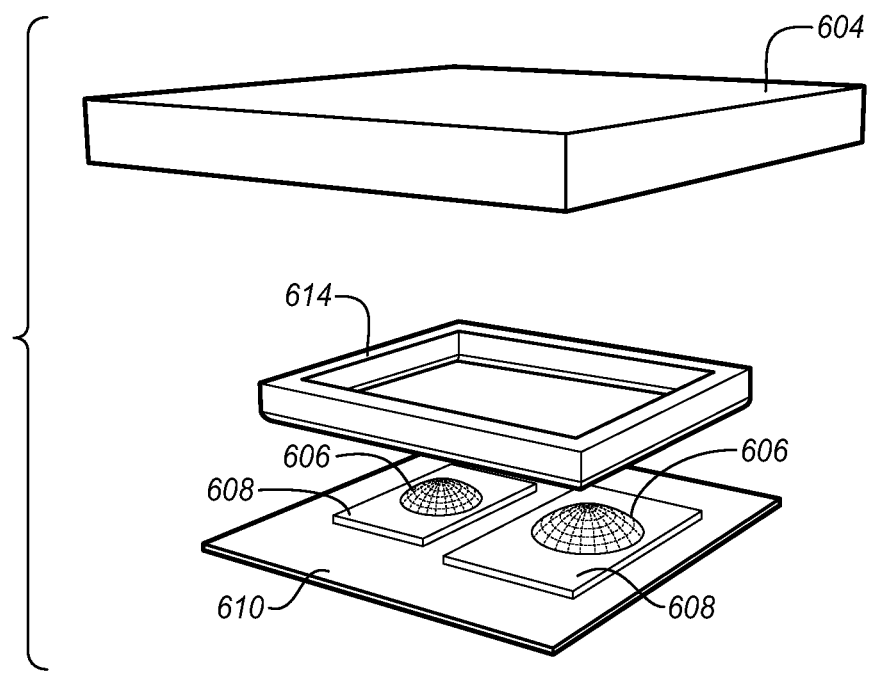
FIG. 6B is an exploded isometric assembly diagram of the pedestal and MCP bare die DUT of FIG. 6A from a different angle of view.

FIGS. 6A and 6B show the same parts also as an exploded isometric view but at a different angle of view.

FIGS. 7A to 7G are cross-sectional views of different variations for the contact surface of the elastomeric seal cross section. The variations are primarily at the tip geometry interfacing the DUT. In FIG. 7A, the seal 514a has a square cross-section with a level bottom surface so that the inside edge of the square contacts an epoxy fillet 516 of the DUT at the perimeter of the die 508 of the DUT. FIG. 7B shows a seal 514b with an off-center triangular tip. FIG. 7C shows a seal 514c with a centered triangular tip. This tip works well with a MUF interface on the DUT in which the tip of the seal is pressed into a trench in the MUF. FIG. 7D shows a seal 514d with a rounded tip. FIG. 7E shows a seal 514e with an inward angled blade. FIG. 7F shows a seal 514f with an outward angled blade. FIG. 7G shows a tip 514g with a multiple-stepped blade.

Any of a variety of different seal geometries may be chosen to provide for a secure seal but to prevent the DUT from sticking to the seal. The selection of an optimal seal geometry can depend on several boundary conditions.

The interface geometry and material of the DUT may affect the choice of seal. A CUF (Capillary Underfill) bare-die with a sloped epoxy fillet, a MUF bare-die, an overmolded round trench, or a lidded die where the lid has a flat nickel-plated copper surface may all use different interface geometries. The seal material, including its surface stickiness, stiffness, and compliance, may affect the choice. The amount of mechanical loading provided to press the pedestal against the DUT during a test may affect the geometry. The chemical environment and the properties of the thermal IF may also be considered.

In one example, an elastomeric seal is formed from a 20-durometer silicone rubber with tacky surface for a CUF bare-die DUT. A rectangular seal geometry, such as that shown in FIG. 7A sticks to the DUT when a conventional thermal IF is used. This hinders the proper release of the DUT. A triangular cross section for the seal 514b as shown in FIG. 7B provides a line of contact with the epoxy filled that does not stick to the DUT.

In addition to geometry, the seal material may be selected from any of a variety of different materials. Some factors that may be considered include stiffness or compliance, typically measured in durometers. The compliance is balanced against the load applied by the pedestal. The surface quality as sticky or tacky versus dry may be balanced for a better seal per contact area versus picking up foreign material (FM) after many test cycles. The operating temperature range may be between about −5° C. and 130° C. for a typical test cycle. The durability of the seal may be balanced against cost and other factors. In addition, the compatibility of the seal with the channel of the pedestal may be considered. A precision mold casting provides an inexpensive accurate configuration for the pedestal and a good seal material may be selected to be compatible with the pedestal including the materials from which it is made and how it is fabricated.

In one embodiment the seal is made from 20-durometer or 30-durometer silicone rubbers, which successfully provide seals for up to 100,000 k cycles at 105° C. without visible seal damage, have an operating temperature range from −55° C. to 300° C., and can be precision cast molded.

FIGS. 8A to 8H shows the process flow for testing a die package using an elastomeric seal in a particular test equipment platform. This example is provided in the context of a configurable test handler (CTH), which may be used to test high-power, long test-time products. FIGS. 8A to 8H show a sequence of thermal and mechanical boundary conditions for the thermal interface fluid with the seal during a test socketing and un-socketing sequence. In FIG. 8A a die 804 attached to a package substrate 806 forms a DUT. While a simple bare die and substrate are shown, the same or similar process may be applied to other package types including a covered die or lidded die and a stacked or side-by-side die configuration as shown in the other drawings herein. The DUT is placed into a soak shuttle 808 as shown. The soak shuttle is a heated plate, tray or holder configured to bring the DUT to a particular set elevated temperature through external heating. The DUT may also be heated through internal heating caused by operating the DUT at speed. The soak shuttle allows a thermal stress test to be performed more quickly because the DUT starts the test at an elevated temperature. A thermal interface fluid 802 is then applied to the top of the DUT.

In FIG. 8B after the thermal IF is applied, a pre-heated thermal head 810 is brought over the DUT and contacts the top of the DUT where the thermal IF was applied. The thermal head may include a pedestal and thermal unit together as shown, for example, in FIG. 1 or any of a variety of other configurations. The thermal head has an elastomeric seal 812 which seals the thermal IF into place with the DUT. In the illustrated example, the seal is pushed down against the package substrate, either directly or through an epoxy fillet to seal the perimeter of the die or dies of the DUT. As the thermal head is pressed down over the DUT, the thermal IF is spread over the top surface of the die or dies to improve thermal conductivity between the thermal head and the DUT.

After the DUT is warmed as desired and the thermal connection with the thermal head is established through the thermal IF, the thermal head may then lift the DUT from the soak shuttle as in FIG. 8C and move it to a test socket 814 as in FIG. 8D. The test socket has an array of connectors 816 for the power and signal contacts of the DUT and applies voltages and signals to the contacts to test the DUT. In the illustrated example, the test socket is in the form of a test bed with a bed of nails connection.

The connectors 816 are coupled to a substrate and circuit traces that allow the test socket to be coupled to a test signal generator and signal processor among other components (not shown). These components generate test signals, apply power, receive signal outputs and measure the characteristics of the die as in FIG. 8E. These components are not shown in order to simplify the drawing. A variety of different types of test sockets or other test system may be used with or without a socket, depending on the particular implementation, the type of test, and the type of DUT. The die generates heat and the test process applies any desired test to the DUT. The thermal head is coupled to heaters, coolers, or both and control the temperature of the DUT during the test.

After the test is completed, in FIG. 8F the thermal head lifts the DUT from the socket and then moves it to a different location. In the illustrated example of FIG. 8G, the DUT is moved back to the same or a different soak shuttle 808 which allows the DUT to cool slowly by applying heat to the DUT that reduces over time until the DUT returns to room temperature. By extending the cool down time in the soak shuttle, the thermal stress on the DUT is reduced. Finally, the thermal head 810 is pulled away from the DUT 804, 806. In FIG. 8H the thermal head releases the DUT and moves up to disengage from the DUT and the soak shuttle 808.

As shown, a full seal is achieved when the thermal head sockets into the test socket with full test loading. Other than providing a sealed environment for the thermal interface fluid, the elastomeric seals do not interfere with the test process flow.

Without the elastomeric seal in a typical test cycle the temperature rise begins after about 60 seconds at 112° C. at the corners and edges of the die. The thermal IF begins to be lost at the die periphery at this time due to evaporation. This is followed by a sharp spike of temperature rise toward the center of the die after about 180 sec. This is caused by a depletion of the thermal IF in the middle of the die. After about 200 sec., die power must be cut off to prevent the die being destroyed by overheating. In contrast, with the seal, the temperature holds much more steadily throughout a 5 minute test. Even though the initial maximum die temperature may be higher, a mild temperature rise is starts after about 80 sec. The die temperature at all locations may be maintained by the thermal head to within 3° C. of the initial temperature for the duration of a 5 min. test.

In addition, the same die power results in a slightly higher die temperature when the seal is used than without the seal. The seal causes a small increase in the thermal interface resistance due to the increase in the IF bond-line thickness. The seal preload is absorbing some of the mechanical die load, resulting in an increased bond-line thickness for the thermal IF. The bond-line thickness may be controlled by adjusting the seal height, the cross-sectional profile and the softness of the seal.

In addition to evaporating from between the die and the pedestal, the thermal IF may also stain the die and leave deposits on the pedestal. In addition to a negative aesthetic effect, the stains make it difficult to inspect the die for cracks and other flaws. Deposits cause a surface roughness that reduces the thermal conduction between the die and the pedestal. When a liquid thermal IF is used to trim temperature sensors and adjust temperature junction rise, the inconsistent thermal conduction across the die may cause inaccurate trimming and other adjustments.

Performance can be increased and cost reduced by removing the thermal IF, also referred to as LTIM (Liquid Thermal Interface Material), after each die test. The elastomeric seal described above may be used to help with fluid removal but it is not necessary. Improving the removal of the thermal IF provides a cleaner surface for the next die to make a thermal connection with the pedestal of the test equipment. Improving the thermal IF removal also reduces any die staining caused by left over thermal IF.

As described herein, a thermal test head may be used with a main pedestal, which has plumbing to support the dispensing and the removal of the thermal IF. The pedestal may have vacuum routing on the circumference of the die for removal and pressure routing to the die center for removal of the liquid from the die surface.

Figure 9A:
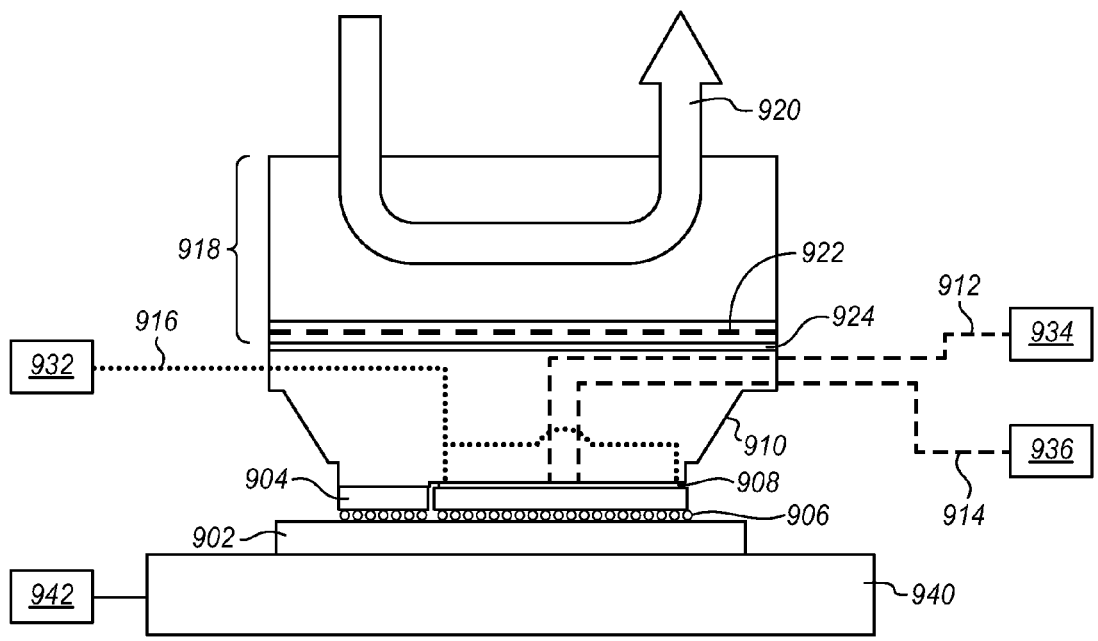
FIG. 9A is a cross-sectional diagram of test equipment for testing a bare die package according to an embodiment.

FIG. 9A is a cross-sectional diagram of a test setup for testing a bare die package. The thermal head 918 has a heating capability through heaters 922 and a liquid cooling channel 920 that transfers to a pedestal 910 through a thermal grease 924. The pedestal uses internal plumbing 912 to deliver the IF material at the beginning of a test. The IF creates a better thermal contact with the main surface of a die 904 that is being tested. The dispense port is coupled to an IF supply reservoir and pump 934. At the end of a test, a vacuum port 916 in the pedestal removes the IF from the edge of the die. The vacuum port is coupled to an external vacuum pump 932 through an appropriate line.

The die is attached to a package substrate 902 through a C4 (Controlled Collapse Chip Connection) contact array in this example, however, the techniques described herein may be applied to any of a variety of different package and die types and combinations. The package substrate is electrically and physically coupled to a test bed 940. The test bed connects to electrical connections on the die to test functions of the die through the package substrate. The test bed is driven by an external controller 942. The external controller may be coupled to multiple test beds to drive the tests of the die.

The pedestal 910 has a pressurized air port 914 near the center of the die and near the dispense port 912. The pressure port is coupled to an air pump 936 through an appropriate line. Alternatively, the same port may be used both to dispense the IF and to provide pressurized air. The die edges are connected to a vacuum line 916. This creates a positive pressure at the die center with a negative pressure on the edge.

Figure 9B:
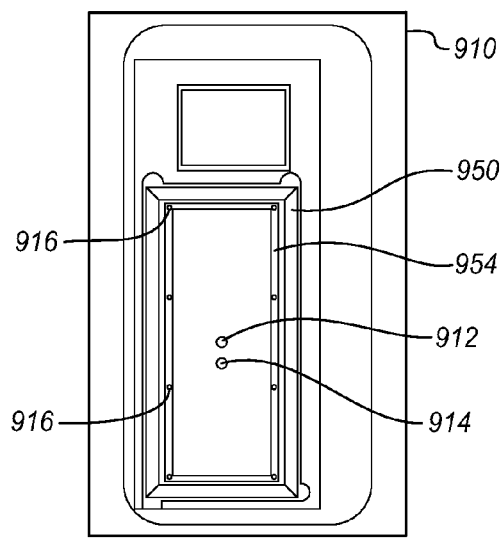
FIG. 9B is bottom plan diagram of the pedestal of FIG. 9A according to an embodiment.

The bottom surface of the pedestal 910 facing the die is shown in the bottom plan view of FIG. 9B. This surface may be surfaced with a hash pattern, radial grooves or any other surface, depending on the particular implementation. As shown, the dispense port 912 and the pressure port 914 are located near each other near the center of where the top of the die will be located. These ports lead to channels (not shown) in the pedestal. An elastomeric seal 950 as described above is in a rectangular shape around the periphery of the die so that it rests against the package just outside of the outside edge of the die, however, the particular position of the seal may be adapted to suit different packages.

Figure 10:
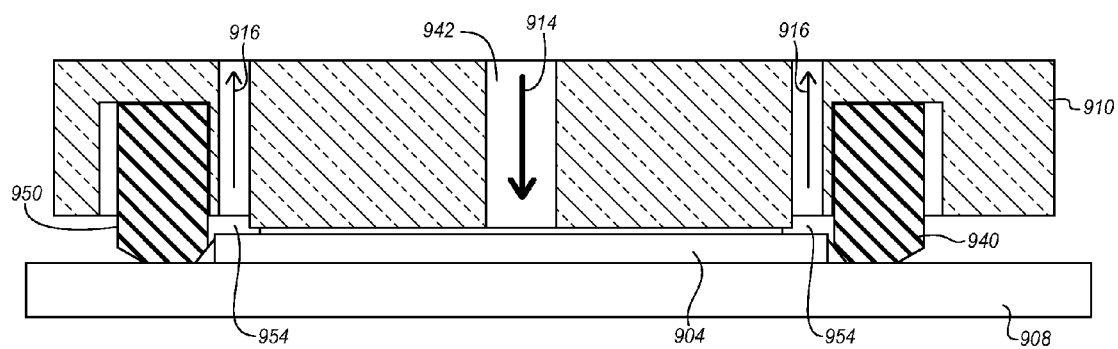
FIG. 10 is side cross-sectional diagram of pressure and air flow between a pedestal and a DUT according to an embodiment.

A vacuum channel extends across the bottom surface of the pedestal within the seal 950 and therefore when in place over a die also across the top surface of the die and also around the periphery of the die inboard of the seal. As a result the vacuum draws the thermal IF from between the pedestal and the die. The thermal IF is constrained within this space by the seal. The vacuum channel has a trench 954 that follows along the path of the seal just inside of the seal. The trench is formed by the raised edge in the pedestal as shown in FIG. 10. At specific locations in the trench 954, individual separate vacuum ports 916 connect the chamber formed by the trench to the vacuum pump. The ports apply a general pull toward the trench and within the trench to each of the ports. The number, location, and configuration of the ports may be adapted to suit different packages.

The vacuum and pressure ports as well as the channel to hold the die may be constructed as part of a monolithic pedestal as shown in FIG. 9A or adapter plates may be milled to accommodate different package shapes and configurations. Similarly the thermal head may be integrated with the pedestal as a single piece or provided separately as shown in FIG. 9A. The particular construction and number of separate components for producing the thermal head, the pedestal and all of the channels, sensors, and controls may be adapted to suit different test equipment and different test volume demands.

As shown, the circumference of the pedestal on the die side has very small vacuum ports which are in between the space formed by the die pedestal and the die seal thus creating a vacuum channel in this space. This space can be milled to allow different routing for different packages. The pressure ports may also be milled to the exact location of the port or ports to be varied relative to the die surface for different dies.

The pressure and vacuum together create a push-pull effect. The push-pull is in the form of an air pressure gradient across die from the center outwards and a resulting pressure on the fluid during removal. As described, the fluid is pressurized from the center of the die and drawn by a vacuum towards the die edge. Alternatively, the fluid may be pressurized in the opposite direction from pressure ports on the edge to central vacuum ports.

With the application of the pressurized air, the gradient formed is multiple times greater than that of a vacuum alone. This makes the removal faster and more effective with no wet droplets leftover. In addition there are no stagnation points below the vacuum port due to the pull of the vacuum. This reduces the possibility of die stains. Since the center port is pressurized there is no stagnation point are a very small stagnation point.

As shown in FIG. 10, the fluid which is blown to the die edges may be contained by the use of the elastomeric seal 950 that seals against the die epoxy fillet of the silicon device. The seal 950 constrains the thermal interface fluid within the space between the electronic component, in this case a packaged die 904, and the pedestal 910. This space includes a trench 954 around the die. While in FIG. 10, the trench is formed by the pedestal, the trench 324 may also be formed in the package substrate 322 as shown, for example, in FIG. 3 or in both or other places. The seal restricts the fluid and air from escaping the chamber onto the package substrate and the test equipment such as a package socket. The space just inside of the seal acts like a channel since the pedestal is undersize relative to the die. This allows the IF to recollect prior to being drawn out through the vacuum ports connected to the channel. When both the pressure and vacuum ports are open the fluid has a clear directional flow to be effectively removed from the die surface quickly and cleanly.

FIG. 10 is an expanded cross-sectional diagram of the package and pedestal showing the movement of the air. The pedestal 910 is placed over the die 904 which is mounted to a package substrate 902. Elastomeric seals 940 of the pedestal are pressed against the package on either side of the die. The pedestal has high pressure air flow through the center channel 914 which blows against the IF (not shown) on the top of the die. At the same time a vacuum pump pulls the pressurized air with the IF through vacuum channels 916 at the edge of the die. The seal 950 rests around the perimeter of the die just outside of the edge of the die and the vacuum channels are inside the seals also at the edge of the die. The vacuum channels may be at specific locations around the edge of the die or there may be a peripheral channel around all or most of the periphery of the die. As shown the pedestal has a raised edge near the edge of the die which creates a chamber 954 around the peripheral edge of the die. The chamber collects the IF and pressurized air to be drawn out by the vacuum port or ports 916. The particular shape of the edge and the chamber as well as the size, shape, and position of the seal may be adapted to suit different package types and test equipment.

The operation of the pedestal and test system of FIG. 9 may be described as first placing a silicon device in a test socket. The pedestal is brought down over the device and an appropriate pressure or die and package loading is applied through the pedestal on to the device. Alternatively, and as shown in FIG. 8, the pedestal may be placed over the device and then the device is carried to the test socket. The IF or IF is then dispensed through a dispense port to cover die surface. The unit may then be tested. The thermal control head is used to control the temperature of the device and the socket is used to apply test signals and other electrical test conditions to the device.

After the test is over, pressure and vacuum valves are opened to apply the pressure gradient through the removal channels for a set amount of time to remove the IF. The pedestal is then unloaded, the device is unsocketed, and the device removed from the test unit.

The pressurized vacuum removes the IF from the die surface without the interference of stagnation points. The elastomeric seal, if used, deters the IF from evaporating before the testing is complete and helps to ensure that more of the IF is removed.

The push-pull system for IF removal effectively removes the fluid with minimal die staining and therefore minimal discoloration of the die and wear on the pedestal surface. There are no remaining droplets and or stains on the substrate or on the epoxy of the package from either the dispensing of the IF or its removal when the seal is used. All of the fluid is adequately and consistently contained and removed below the pedestal surface.

As an alternative, the seal and vacuum may be removed. A central port in the center of the pedestal may be connected to a pressure line and used as the pressure port as shown herein. Without a seal, the IF is blown off the die but not picked up from the edges. The IF then is pushed out from between the die and the pedestal and onto the epoxy and package surfaces. However die staining on the die surface is still drastically reduced. The epoxy and package surface may then be cleaned in some other way, depending on the particular implementation. Alternatively, a cover may be applied over the package substrate to collect the IF.

Figure 11:
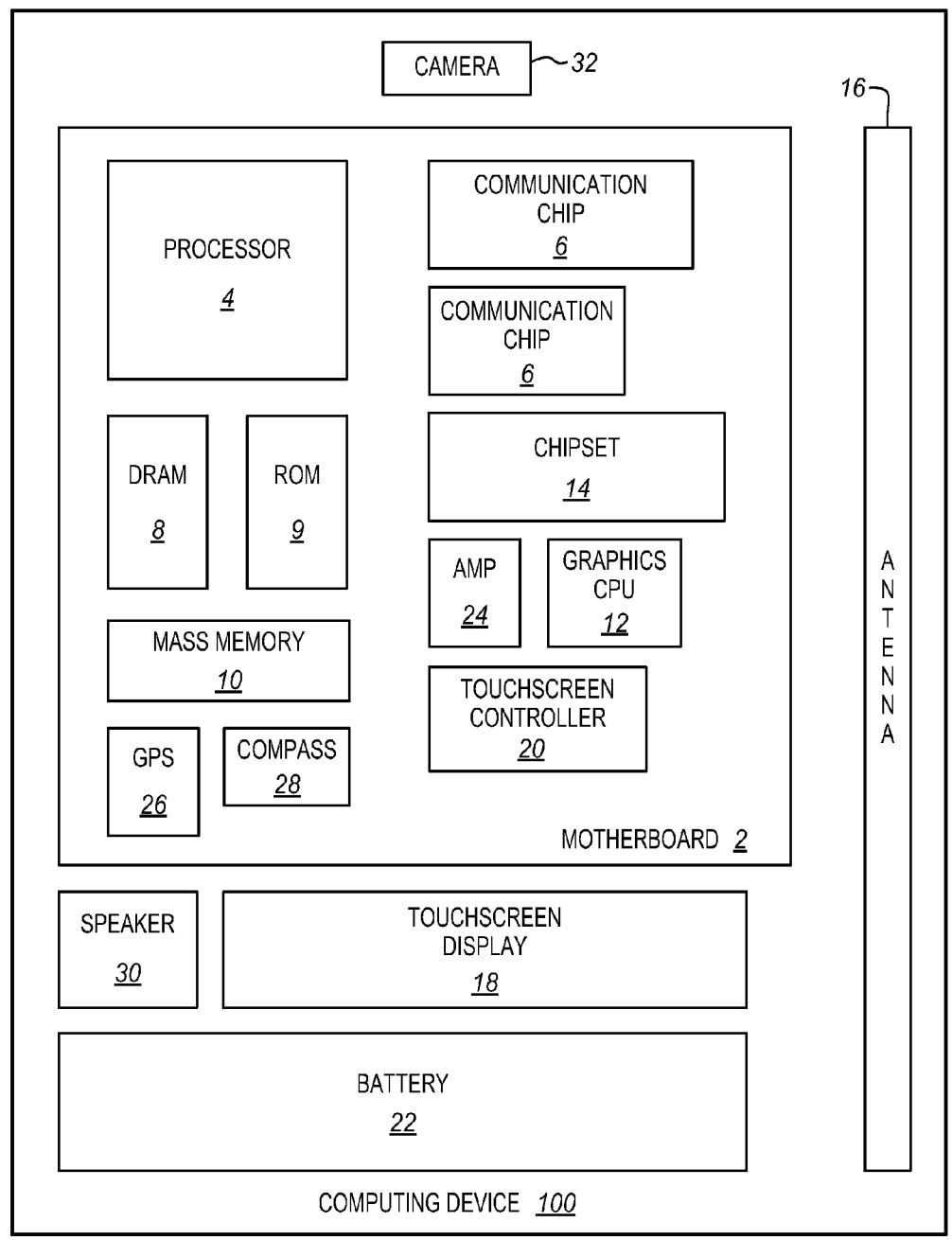
FIG. 11 is a block diagram of a computing device incorporating a tested electronic component according to an embodiment.

FIG. 11 illustrates a computing device 11 in accordance with one implementation of the invention. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 11 includes an integrated circuit die packaged within the processor 4. In some implementations of the invention, the integrated circuit die of the processor, memory devices, communication devices, or other components include one or more dies that are tested as described herein, if desired. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to system having a thermal control unit adapted to control the temperature of at least a portion of an electronic component during testing, a pedestal between the thermal control unit and the electronic component to conduct heat from the electronic component to the thermal head, a conduit extending through a portion of the pedestal, to permit the flow of a liquid thermal interface material from an external source to a space between the pedestal and the electronic component, the liquid thermal interface material to improve heat conduction between the electronic component and the pedestal, and an elastomeric seal between the electronic device and the pedestal to constrain the thermal interface fluid within the space between the electronic component and the pedestal.

In further embodiments the pedestal includes a surface adapted to make thermal contact with the electronic component, the surface including a plurality of grooves therein. The plurality of grooves are in a crossing pattern. The pedestal includes a surface adapted to make thermal contact with the electronic component, the surface being polished to be substantially flat.

In further embodiments, the electronic component comprises a die and the elastomeric seal extends around the periphery of the die. The electronic component comprises a substrate and the elastomeric seal extends from the pedestal to the substrate. The electronic component comprises a die, the system further comprising a filler along the perimeter of the die and the elastomeric seal contacts the filler. The filler comprises a fillet around the outer edge of the die. The elastomeric seal has a beveled edge to seal against the electronic component.

Further embodiments include a first pump to pump air into the space between the electronic component and the pedestal and a second pump to remove the liquid thermal interface material from the space. In further embodiments, the first pump is coupled to a conduit in the pedestal near a center of the electronic component and the second pump is coupled to the periphery of the electronic component. The first pump is coupled to the periphery of the electronic component and the second pump is coupled to a conduit in the pedestal near a center of the electronic component.

Further embodiments pertain to a method including delivering a liquid thermal interface material through a pedestal and onto an electronic component, the pedestal having a conduit through which the liquid thermal interface material may flow to a space between the pedestal and the electronic component, the liquid thermal interface material to improve heat conduction between the electronic component and the pedestal, performing a test operation of the electronic component having the thermal interface material thereon, and after performing a test operation, removing at least a portion of the liquid thermal interface material by applying air pressure onto the electronic component near a center of the surface of the electronic component to remove the thermal interface material from the space between the pedestal and the electronic component.

In further embodiments, the pedestal comprises a second conduit and applying air pressure comprises applying air pressure through the second conduit. Removing further comprises drawing the liquid thermal interface material toward the edges of the electronic component using a vacuum pump.

Further embodiments include moving the pedestal and component to a test fixture before performing the test operation, and moving the pedestal and component away from the test fixture before removing. Further embodiments include pressing an elastomeric seal between the pedestal and the electronic component to constrain the thermal interface fluid within the space between the electronic component and the pedestal.

Further embodiments pertain to a silicon device test apparatus including a thermal head having a thermal control unit adapted to control the temperature of at least a portion of an electronic component during testing, the electronic component having a die mounted to a substrate, a pedestal of the thermal head between the thermal control unit and the die to conduct heat from the die to the thermal head, a supply conduit extending through a portion of the pedestal, to permit the flow of a liquid thermal interface material from an external source to a space between the pedestal and the die, the liquid thermal interface material to improve heat conduction between the die and the pedestal during a test of the die, a removal conduit extending through a portion of the pedestal and coupled to a pump to remove the liquid thermal interface material from the space after the test of the die, an elastomeric seal between the substrate and the pedestal to constrain the thermal interface fluid within the space between the electronic component and the pedestal the elastomeric seal being fastened to the pedestal and pressed against the substrate by the pedestal to seal against the substrate, a test bed to connect to the die through the substrate, and a controller to drive the test of the die through the test bed.

In further embodiments, the electronic component further comprises a fillet along the perimeter of the die and the elastomeric seal contacts the fillet.

Further embodiments include a second pump coupled to a pressure conduit to pump air into the space between the electronic component to remove the liquid thermal interface material from the space, the pressure conduit having an outlet near a center of the electronic component and the removal conduit being coupled to the periphery of the electronic component.

Further embodiments relate to a system for handling thermal interface fluid that includes means for thermal control adapted to control the temperature of at least a portion of an electronic component during testing, a pedestal between the thermal control unit and the electronic component to conduct heat from the electronic component to the thermal head, a conduit extending through a portion of the pedestal, to permit the flow of a liquid thermal interface material from an external source to a space between the pedestal and the electronic component, the liquid thermal interface material to improve heat conduction between the electronic component and the pedestal, and means for sealing between the electronic device and the pedestal to constrain the thermal interface fluid within the space between the electronic component and the pedestal.

In further embodiments, the pedestal includes a surface adapted to make thermal contact with the electronic component, the surface including a plurality of grooves therein. The electronic component comprises a die and the means for sealing extends around the periphery of the die. The electronic component comprises a substrate and the means for sealing extends from the pedestal to the substrate.

Embodiments further include a first pump means to pump air into the space between the electronic component and the pedestal and a second pump means to remove the liquid thermal interface material from the space. In further embodiments, the first pump means is coupled to a conduit in the pedestal near a center of the electronic component and the second pump means is coupled to the periphery of the electronic component. In further embodiments, the first pump means is coupled to the periphery of the electronic component and the second pump means is coupled to a conduit in the pedestal near a center of the electronic component.

What is claimed is:

1. A system comprising:
    a thermal control unit adapted to control the temperature of at least a portion of an electronic component during testing, the electronic component comprising a die attached to a substrate and a filler on the substrate around the perimeter of the die;
    a pedestal between the thermal control unit and the electronic component, the pedestal being attached to the thermal control unit for thermal conduction to conduct heat from the electronic component to the thermal control unit, the pedestal defining a trench to carry an elastomeric seal and a cavity near the trench and surrounding the die, the pedestal applying a mechanical load against the electronic component during testing;
    a liquid thermal interface material from an external source in a space between the pedestal and the electronic component, the liquid thermal interface material to improve heat conduction between the electronic component and the pedestal; and
    the elastomeric seal in the trench and extending between the electronic component and the pedestal to form a seal against the filler and around the cavity and to constrain the thermal interface fluid within the cavity and the space between the electronic component and the pedestal during testing, the elastomeric seal also absorbing some of the mechanical load between the pedestal and the electronic component during testing.

2. The system of claim 1, wherein the pedestal includes a surface adapted to make thermal contact with the electronic component, the surface including a plurality of grooves therein.

3. The system of claim 2, wherein the plurality of grooves are in a crossing pattern.

4. The system of claim 1, wherein the pedestal includes a surface adapted to make thermal contact with the electronic component, the surface being polished to be substantially flat.

5. The system of claim 1, wherein the elastomeric seal extends around the periphery of the die.

6. The system of claim 1, wherein the elastomeric seal extends from the pedestal to the substrate.

7. The system of claim 1, wherein the filler comprises a fillet around the outer edge of the die.

8. The system of claim 1, wherein the elastomeric seal has a beveled edge to seal against the electronic component.

9. The system of claim 1, further comprising a first pump to pump air into the space between the electronic component and the pedestal and a second pump to remove the liquid thermal interface material from the space.

10. The system of claim 9, wherein the first pump is coupled to a conduit in the pedestal near a center of the electronic component and the second pump is coupled to the periphery of the electronic component.

11. The system of claim 9, wherein the first pump is coupled to the periphery of the electronic component and the second pump is coupled to a conduit in the pedestal near a center of the electronic component.

12. A silicon device test apparatus comprising:
    a thermal head having a thermal control unit adapted to control the temperature of at least a portion of an electronic component during testing, the electronic component having a die mounted to a substrate and a filler on the substrate around the perimeter of the die;
    a pedestal of the thermal head between the thermal control unit and the die, the pedestal being attached to the thermal control unit for thermal conduction to conduct heat from the die to the thermal head, the pedestal defining a trench to carry an elastomeric seal and a cavity near the trench and surrounding the die, the pedestal applying a mechanical load against the electronic component during testing;
    a liquid thermal interface material from an external source in a space between the pedestal and the die, the liquid thermal interface material to improve heat conduction between the die and the pedestal during a test of the die;
    a removal conduit extending through a portion of the pedestal and coupled to a pump to remove the liquid thermal interface material from the space after the test of the die;
    the elastomeric seal in the trench and extending between the substrate and the pedestal to form a seal against the filler and around the cavity and to constrain the thermal interface fluid within cavity and the space between the electronic component and the pedestal the elastomeric seal being fastened to the pedestal and pressed against the substrate by the pedestal to seal against the substrate during testing, the elastomeric seal also absorbing some of the mechanical load between the pedestal and the electronic component during testing;
    a test bed to connect to the die through the substrate; and
    a controller to drive the test of the die through the test bed.

13. The test apparatus of claim 12, wherein the filler comprises a fillet along the perimeter of the die and wherein the elastomeric seal contacts the fillet.

14. The test apparatus of claim 12, further comprising a second pump coupled to a pressure conduit to pump air into the space between the electronic component to remove the liquid thermal interface material from the space, the pressure conduit having an outlet near a center of the electronic component and the removal conduit being coupled to the periphery of the electronic component.

15. The system of claim 1, wherein the thermal control unit comprises heaters and a liquid cooling system to control the temperature of the electronic component.

16. The system of claim 1, further comprising a conduit extending through a portion of the pedestal to permit the flow of the thermal interface material from the external source into the space between the pedestal and the electronic component.

* * * * *